United States Patent
Zhu et al.

(10) Patent No.: US 6,735,112 B2
(45) Date of Patent: May 11, 2004

(54) MAGNETO-RESISTIVE MEMORY CELL STRUCTURES WITH IMPROVED SELECTIVITY

(75) Inventors: Theodore Zhu, Mission Viejo, CA (US); Yong Lu, Rosemount, MN (US); Anthony Arrott, Washington, DC (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/068,465

(22) Filed: Feb. 6, 2002

(65) Prior Publication Data

US 2003/0147273 A1 Aug. 7, 2003

(51) Int. Cl.$^7$ ............................................. G11C 11/15
(52) U.S. Cl. .................... 365/158; 365/171; 365/173
(58) Field of Search ................. 365/171, 158, 365/173

(56) References Cited

U.S. PATENT DOCUMENTS

| | | | |
|---|---|---|---|
| 5,465,185 A | * 11/1995 | Heim et al. | 360/324.11 |
| 5,828,598 A | 10/1998 | Chen et al. | 365/158 |
| 5,841,692 A | 11/1998 | Gallagher et al. | 365/173 |
| 5,966,012 A | 10/1999 | Parkin | 324/252 |
| 6,005,800 A | * 12/1999 | Koch et al. | 365/173 |
| 6,144,524 A | * 11/2000 | Haratani et al. | 360/324.12 |
| 6,166,948 A | 12/2000 | Parkin et al. | 365/173 |
| 6,172,904 B1 | 1/2001 | Anthony et al. | 365/173 |

OTHER PUBLICATIONS

Dimitrov at al., "Enhanced magnetic stability in spin valves with synthetic antiferromagnet" *Journal of Applied Physics* 87(9):6427–6429 (May 2000).

Leal and Kryder, "Spin Valves biased by Co/Ru/Co Sythetic antiferromagnets" *Journal of Applied Physics* 83(7):3720–3723 (Apr. 1998).

* cited by examiner

*Primary Examiner*—Richard Elms
*Assistant Examiner*—J. H. Hur
(74) *Attorney, Agent, or Firm*—Knobbe, Martens, Olson & Bear, LLP

(57) ABSTRACT

A magneto-resistive memory comprising magneto-resistive memory cells is disclosed, comprising two pinned magnetic layers on one side of a free magnetic layer. The pinned magnetic layers are formed with anti-parallel magnetization orientations such that a net magnetic moment of the two layers is substantially zero. The influence of pinned magnetic layers on free magnetic layer magnetization orientations is substantially eliminated, allowing for increased predictability in switching behavior and increased write selectivity of memory cells.

15 Claims, 4 Drawing Sheets

MAGNETO-RESISTIVE MEMORY CELL STRUCTURES WITH IMPROVED SELECTIVITY

BACKGROUND OF THE INVENTION

1. Field of the Invention

The present invention relates to magneto-resistive memories, and more particularly, to magneto-resistive memory cell structures that offer superior selectivity of memory cells.

2. Description of the Related Art

As computer memory technology advances, magneto-resistive memory has emerged as a possible replacement for conventional memory devices. Magneto-resistive memories are non-volatile and employ the magneto-resistive effect to store memory states. These memories typically use the magnetization orientation of a layer of magneto-resistive material to represent and to store a binary state. For example, magnetization orientation in one direction may be defined as a logic "0", while magnetization orientation in another direction may be defined as a logic "1".

The ability to read stored binary states is a consequence of the magneto-resistive effect. This effect is characterized by a change in resistance of multiple layers of magneto-resistive material, depending on the relative magnetization orientations of the layers. Thus, a magneto-resistive memory cell typically has two magnetic layers that may change orientation with respect to one another. Where the directions of the magnetization vectors point in the same direction, the layers are said to be in a parallel orientation and where the magnetization vectors point in opposite directions, the layers are said to be oriented anti-parallel. In practice, typically one layer, the free or "soft" magnetic layer, is allowed to change orientation, while the other layer, the pinned or "hard" magnetic layer, has a fixed magnetization orientation to provide a reference for the orientation of the free magnetic layer. The magnetization orientation of the two layers may then be detected by determining the relative electrical resistance of the memory cell. If the magnetization orientation of its magnetic layers are substantially parallel, a memory cell is typically in a low resistance state. In contrast, if the magnetization orientation of its magnetic layers is substantially anti-parallel, the memory cell is typically in a high resistance state. Thus, ideally, in typical magneto-resistive memories, binary logic states are stored as binary magnetization orientations in magneto-resistive materials and are read as the binary resistance states of the magneto-resistive memory cells containing the magneto-resistive materials.

Giant magneto-resistive (GMR) and tunneling magneto-resistive (TMR) memory cells are two common types of memory cells that take advantage of this resistance behavior. In GMR cells, the flow of electrons through a conductor situated between a free magnetic layer and a pinned magnetic layer is made to vary, depending on the relative magnetization orientations of the magnetic layers on either side of the conductor. By switching the magnetization orientation of the free magnetic layer, the electron flow through the conductor is altered and the effective resistance of the conductor is changed.

In TMR cells, an electrical barrier layer, rather than a conductor, is situated between a free magnetic layer and a pinned magnetic layer. Electrical charges quantum mechanically tunnel through the barrier layer. Due to the spin dependent nature of the tunneling, the extent of electrical charges passing through the barrier vary with the relative magnetization orientations of the two magnetic layers on either side of the barrier. Thus, the measured resistance of the TMR cell may be switched by switching the magnetization orientation of the free magnetic layer.

Switching the relative magnetization orientations of the magneto-resistive materials in the memory cell by applying an external magnetic field is the method commonly used to write a logic state to a magneto-resistive memory cell. The magnitude of the applied magnetic field is typically sufficient to switch the magnetization orientation of the free magnetic layer, but not large enough to switch the pinned magnetic layer. Thus, depending on the desired logic state, an appropriately aligned magnetic field is applied to switch the magnetization orientation of the free magnetic layer so that the magneto-resistive memory cell is in either a high or a low resistance state.

Magneto-resistive memory cells are typically part of an array of similar cells and the selection of a particular cell for writing is usually facilitated by use of a grid of conductors. Thus, magneto-resistive memory cells are usually located at the intersections of at least two conductors. A magneto-resistive memory cell is typically selected for writing by applying electrical currents to two conductors that intersect at the selected magneto-resistive memory cell. With current flowing through it, each conductor generates a magnetic field and, typically, only the selected magneto-resistive memory cell receives two magnetic fields, one from each conductor. The current flowing through each conductor is such that the net magnetic field from the combination of both these magnetic fields is sufficient to switch the magnetization orientation of the selected cells. Other magneto-resistive memory cells in contact with a particular conductor usually receive only the magnetic field generated by that particular conductor. Thus, the magnitudes of the magnetic fields generated by each line are usually chosen to be high enough so that the combination of both fields switches the logic state of a selected magneto-resistive memory cell but low enough so that the other magneto-resistive memory cells which are subject to only one magnetic field do not switch.

In addition to the two conductors for writing, memory arrays with three conductors connecting magneto-resistive memory cells have also been developed. The additional conductor may be used exclusively for sensing the resistance of a particular memory cell, allowing another conductor to be used exclusively for writing. In this way, writing and reading operations may be performed simultaneously, increasing the speed of data access.

Magneto-resistive memory technology continues to mature and work continues in refining implementation of magneto-resistive memory cells.

SUMMARY OF THE INVENTION

The preferred embodiments of the present invention provide magneto-resistive memory cell structures which minimize disruptions to the magnetization orientation of the free magnetic layer caused by pinned magnetic layer magnetic fields. In one embodiment, a magneto-resistive memory cell has an additional pinned magnetic layer and a pinned magnetic layer, with the free magnetic layer and the additional pinned magnetic layer on either side of the pinned magnetic layer. The additional magnetic layer has a magnetization orientation substantially anti-parallel to the magnetization orientation of the pinned magnetic layer. The resulting magnitude of the net magnetic field from the pinned magnetic layer and the additional pinned magnetic layer is too small to affect the magnetization orientation of the free magnetic layer or the magnetization orientation of the free magnetic layers of neighboring magneto-resistive memory cells.

Also provided are methods for constructing the magneto-resistive memory cells of the present invention. In one embodiment, ferromagnetic materials and the thicknesses of the magnetic layers made from the materials are first selected such that the magnitude of the magnetic field from one layer is substantially equal to the magnitude of the magnetic field from the other layer. The magnetic layers are then formed. After formation, the magnetization orientation of each layer is fixed in an opposite direction from the other layer.

Other features and advantages of the present invention will become apparent from the following detailed description, taken in conjunction with the accompanying drawings, illustrating by way of example the teachings of the invention.

DETAILED DESCRIPTION OF THE PREFERRED EMBODIMENTS

To reliably store a state using magneto-resistive memory, it is desirable to have predictability in switching behavior. As such, it is desirable to have a magneto-resistive. memory cell that will switch to a high resistance state by application of a magnetic field of a predictable magnitude and that will also switch to a low resistance state by application of a magnetic field of a predictable magnitude in the opposite direction. Moreover, predictability in switching behavior associated with a particular applied magnetic field will improve the ability to select a particular magneto-resistive memory cell in a magneto-resistive memory cell array. Unfortunately, interactions between the magnetic fields of the pinned and free magnetic layers commonly found in prior magneto-resistive memory cells contribute to unpredictability in switching and, thus, undermine the ability to selectively switch cells.

At short distances on the order of less than about 20 Å, the interactions of the magnetic fields of two ferromagnetic layers may include either antiferromagnetic or ferromagnetic coupling. Antiferromagnetic coupling tends to cause the magnetization orientations of the two layers to be parallel, while ferromagnetic coupling tends to cause anti-parallel magnetization orientations. The extent of each type of coupling oscillates depending, inter alia, on the distance between the two layers.

Figure 1:
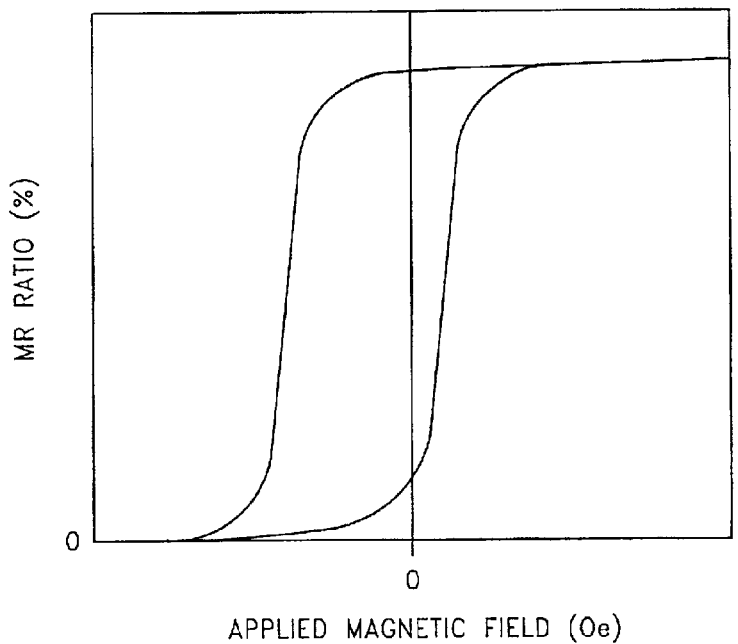
FIG. 1 is a generalized representation of the magneto-resistive behavior of a prior art magneto-resistive memory cell.

Thus, where antiferromagnetic coupling dominates, an applied magnetic field must overcome the influence of this coupling to switch a free magnetic layer to the parallel orientation, while the same antiferromagnetic coupling field will augment an magnetic field applied to switch the same free magnetic layer to the anti-parallel orientation. Thus, as represented in FIG. 1, the magnitude of the applied magnetic field needed to switch the free magnetic layer to the low resistance state is increased while the magnitude of the applied magnetic field needed to switch the free magnetic layer to the high resistance state is decreased. As a consequence, antiferromagnetic coupling fields typically increase the current needed to write the magneto-resistive memory cell to the low resistance state and may cause accidental writing to the high resistance state. In extreme cases, the applied magnetic fields may be insufficient to overcome the demagnetization fields and the free magnetic layer may remain in the anti-parallel orientation.

Figure 2:
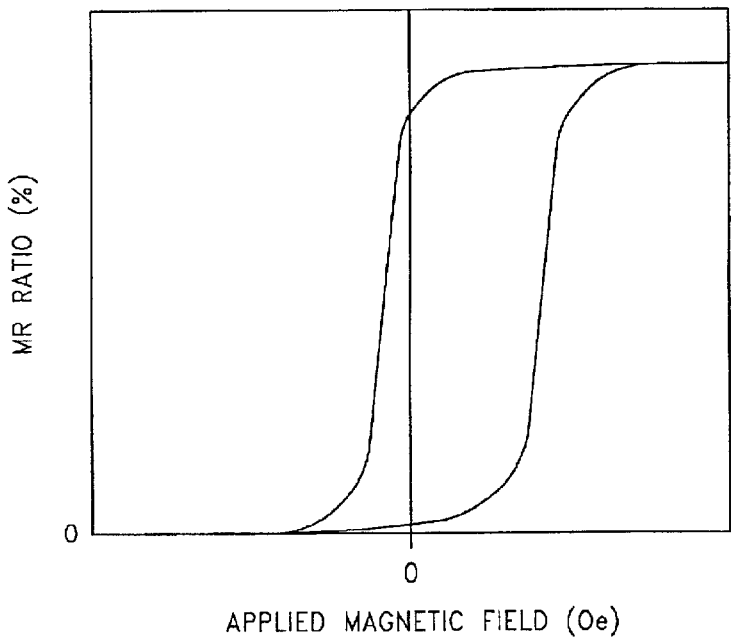
FIG. 2 is an additional generalized representation of the magneto-resistive behavior of a prior art magneto-resistive memory cell.

Alternatively, where ferromagnetic coupling dominates, an applied magnetic field must overcome the influence of this coupling to switch a free magnetic layer to the anti-parallel orientation, while these same coupling fields will augment a magnetic field applied to switch a free magnetic layer to the parallel orientation. Thus, as represented in FIG. 2, ferromagnetic coupling typically increases the power needed to write the magneto-resistive memory cell to the high resistance state and may cause accidental writing to the low resistance state. In extreme cases, ferromagnetic coupling fields may cause a magneto-resistive memory cell to remain in the low resistance state regardless of the applied magnetic field.

In less extreme cases, where antiferromagnetic coupling and ferromagnetic coupling is strong, but where an applied magnetic field is able to switch the magnetization orientation of the free magnetic layer, the coupling between the free and fixed magnetic layers may still be sufficient to cause the magnetization orientation of the free layer to switch back to its previous orientation. In such cases, depending on the strength of coupling with the fixed magnetic layer, the orientation of the free layer may switch spontaneously, undermining the ability of the cell to be used as a non-volatile memory device. Similarly, less extreme antiferromagnetic coupling and ferromagnetic coupling between the pinned magnetic layer of a magneto-resistive memory cell and the free magnetic layers of neighboring magnetoresistive memory cells may cause demagnetization of those neighboring memory cells.

In addition, manufacturing non-uniformity in the thickness of nonmagnetic layers separating two ferromagnetic layers, in conjunction with the distance related oscillations in the degree of antiferromagnetic and ferromagnetic coupling, contribute to unpredictability in free magnetic layer switching behavior. Further, the relative influence of antiferromagnetic and ferromagnetic coupling fields on free magnetic layer magnetization may vary among the magneto-resistive memory cells in a magneto-resistive memory array and may vary between different magneto-resistive memory arrays due to variations in the patterning steps and/or deposition steps of device manufacture. Such variations may lead to unpredictable switching behavior and further undermine memory cell selectivity during write operations.

At longer distances, where the distances between magnetic layers are greater than about 20 Å, magnetostatic interactions may dominate. In this case, stray magnetic fields originating from the pinned layer may interact with and alter the magnetization orientations of the free layer. Moreover, these stray magnetic fields may interact with the magnetization orientations of free magnetic layers in neighboring magneto-resistive memory cells, further undermining the switching predictability of those memory cells. Magnetostatic interactions are of particular concern as work continues on decreasing the distance between memory cells to increase the memory cell density of magneto-resistive memory cell arrays.

U.S. Pat. No. 6,172,904 discloses one possible structure for addressing the problem of unpredictable switching behavior caused by pinned magnetic layer and free magnetic layer coupling within a particular memory cell. That patent describes a structure, illustrated in FIG. 4 of that patent, with a free magnetic layer 4 between two pinned magnetic layers, 6 and 34, with anti-parallel magnetization orientations M1 and M4. The pinned layers 6 and 34 couple to the free magnetic layer 4. Thus, coupling to one pinned layer 6 forces the magnetization orientation M3 of the free magnetic layer 4 in one direction. However, because the structure contains another pinned layer 34 with an opposite magnetization orientation M4 and a magnetic field of the same magnitude, the second pinned layer 34 also couples to the free magnetic layer 4. Each pinned magnetic layer 6 and 34 affects the free magnetic layer 4 in an equal and opposite way, resulting in no net tendency to push the magnetization orientation M3 of the free magnetic layer 4 in any particular direction.

Figure 3:
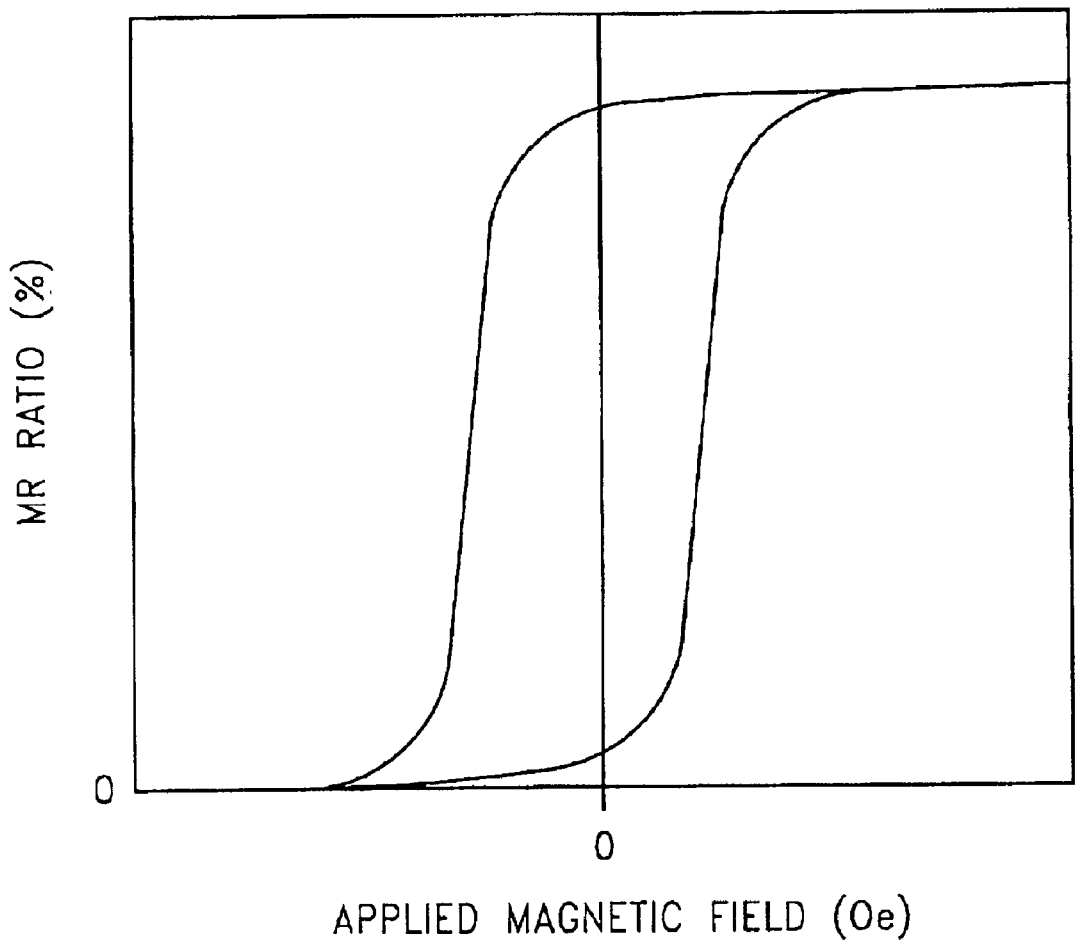
FIG. 3 is a representation of the magneto-resistive behavior of a magneto-resistive memory cell of the present invention.

The preferred embodiments of the present invention takes advantage of the interactions between two fixed layers to increase predictability in switching behavior. As represented in FIG. 3, and discussed further below, the interactions between the two fixed layers allow for switching behavior in which the magnitude of the applied magnetic fields used to switch a magneto-resistive memory cell from a low resistance state to a high resistance state and vice versa are substantially equal. Because of this magneto-resistive behavior, the magnitudes of the current used to write a logic "0" or "1" are substantially equal, and switching predictability and control is increased. In addition, the coupling between the free and pinned magnetic layers of neighboring memory cells is reduced.

Figure 4:
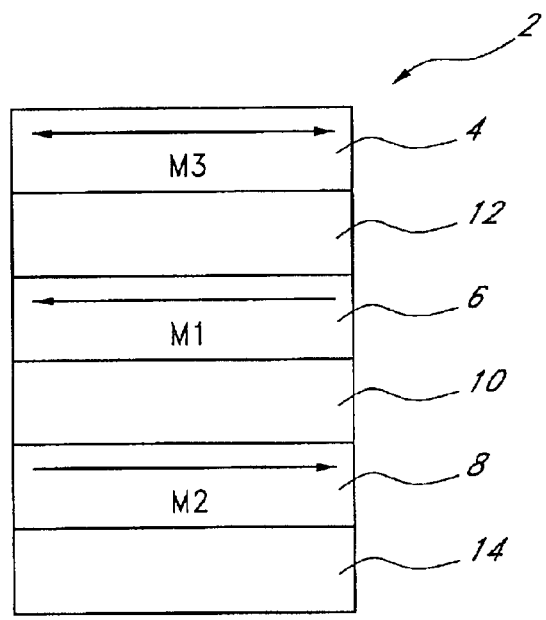
FIG. 4 is a cross-sectional view of one illustrative embodiment of the present invention.

FIG. 4 is a cross-sectional view of one illustrative embodiment of the invention, implemented in the context of a giant magnetoresistive (GMR) memory array. A magneto-resistive memory cell 2 comprises a free layer 4, a pinned magnetic layer 6, and an additional pinned magnetic layer 8. The pinned magnetic layer 6 has a fixed magnetization orientation M1, the additional pinned magnetic layer 8 has a fixed magnetization orientation M2, and the free magnetic layer 4 has a switchable magnetization orientation M3. While the magnetic orientations M1 and M2 are shown pointing in particular directions, in another embodiment these directions may be reversed, so long as their magnetization orientations remain anti-parallel.

To ensure that a net magnetic moment of the pinned magnetic layers 6 and 8 will not affect the magnetization of the free magnetic layer, the orientations, thicknesses, and materials of the pinned magnetic layers 6 and 8 are selected so that the magnitude of the magnetic field of the pinned magnetic layer 6 is substantially opposite to the magnitude of the magnetic field of the additional magnetic layer 8. Because a magnetic field associated with a material may vary depending on the type and quantity of that material, the materials used and the thicknesses of these materials should be taken into account. For example, this may be accomplished by using substantially similar magneto-resistive materials with a substantially similar thickness for each pinned magnetic layer 6 and 8 and orienting the pinned magnetic layers 6 and 8 in substantially opposite magnetization directions. Similarly, where the materials comprising each pinned magnetic layer differ in the strength of the magnetic field associated with that material, the respective thicknesses of the pinned magnetic layers 6 and 8 may be selected so as to compensate for the different materials properties. For example, where the magnetic field associated with the material comprising the additional pinned magnetic layer 8 is of a greater magnitude than the magnetic field associated with the pinned magnetic layer 6, the thickness of pinned magnetic layer 6 may be increased to compensate. As such, the net magnetic field from the pinned magnetic layers 6 and 8 is too small to affect the magnetization orientation of the free magnetic layer 4 or a similar free magnetic layer (not shown) in a neighboring magneto-resistive memory cell, in which case an applied magnetic field of a particular magnitude can switch a magneto-resistive cell 2 to the cell's high resistance state and an opposite applied magnetic field of approximately the same magnitude can switch the same magneto-resistive cell 2 to the cell's low resistance state.

A separating layer 10 preferably separates the pinned magnetic layer 6 from the additional pinned magnetic layer 8. The separating layer 10 is preferably comprised of a conductive material that enhances coupling of the magneto-resistive materials to each other. In this capacity, ruthenium or a similar material may be used. The thickness of the ruthenium layer should be in a range to allow antiferromagnetic coupling between the pinned magnetic layer 6 and the additional pinned magnetic layer 8. Preferably the ruthenium layer is 7–9 Å thick to allow for the antiferromagnetic coupling.

In addition, the pinned magnetic layers 6 and 8 are preferably comprised of ferromagnetic materials, including cobalt, iron-cobalt, nickel iron, nickel-iron-cobalt, or similar material. Where such soft ferromagnetic materials are used, the magnetization orientation of the additional pinned magnetic layer 8 is preferably fixed by an adjacent layer 14 of antiferromagnetic material, in contact with and located directly below the additional pinned magnetic layer 8. The antiferromagnetic material may be iron-manganese, nickel-manganese, iridium-manganese, platinum-manganese, or similar material. The skilled artisan will appreciate that the anti-parallel configuration of pinned magnetic layer 6 and additional pinned magnetic layer 8 allow for use of antiferromagnetic materials of reduced pinning strength, in comparison to magneto-resistive memory cells with a single pinned layer. In another embodiment, the magnetization orientation of the additional pinned magnetic layer 8 is fixed by a layer 14 comprising a permanent magnet material.

In addition, where the coercivities of the pinned magnetic layer 6 and the additional pinned magnetic layer 8 are substantially similar, the adjacent layer 14 may also be useful in the manufacture of the magneto-resistive memory 2. By fixing the magnetization orientation of the additional pinned magnetic layer 8 during the manufacturing process, the pinned magnetic layer 6 may be magnetically oriented, without simultaneously changing the magnetization orientation of the additional pinned magnetic layer 8. The skilled artisan will recognize, however, that an adjacent layer 14 is not necessary to the manufacturing process. For example, simultaneous changing of the magnetization orientation of the additional pinned magnetic layer 8 is a reduced concern where the coercivities of the pinned magnetic layer 6 and the additional pinned magnetic layer 8 are not similar, e.g. where the additional pinned magnetic layer 8 is formed of a material of higher coercivity than the pinned magnetic layer 6 or where the additional pinned magnetic layer 8 is formed of a permanent magnet material.

As with the pinned magnetic layers 6 and 8, the free magnetic layer 4 is preferably also comprised of a soft ferromagnetic material such as cobalt, iron-cobalt, nickel iron, or nickel-iron-cobalt.

The free magnetic layer 4 is separated from the pinned magnetic layer 6 by a non-magnetic interlayer 12. In a preferred embodiment, the non-magnetic interlayer 12 comprises a conductor such as copper to take advantage of the giant magneto-resistive effect, where a read current flows through the conductor of non-magnetic interlayer 12.

Figure 5:
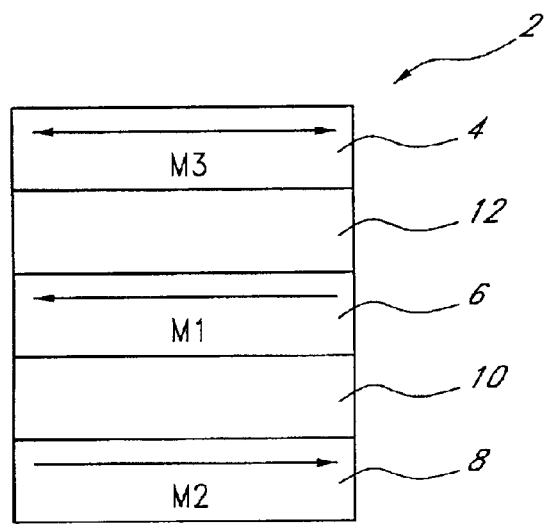
FIG. 5 is a cross-sectional view of another illustrative embodiment of the present invention.

FIG. 5 is a cross-sectional view of another illustrative embodiment of the present invention wherein like features are referenced by like numerals. In this embodiment, the additional pinned magnetic layer 8 is comprised of a permanent magnet, the orientation of which may be fixed by exposure to a large external magnetic field. As such, the magneto-resistive memory cell 2 does not require an antiferromagnetic layer 14 to fix the orientation of additional pinned magnetic layer 8. In another embodiment, the additional pinned magnetic layer 8 comprises a ferromagnetic material with high coercivity such that, in the presence of applied magnetic fields of magnitudes in a range sufficient to switch the free magnetic layer, the magnetic moment of this layer is essentially fixed by its intrinsic magnetic anisotropy.

Figure 6:
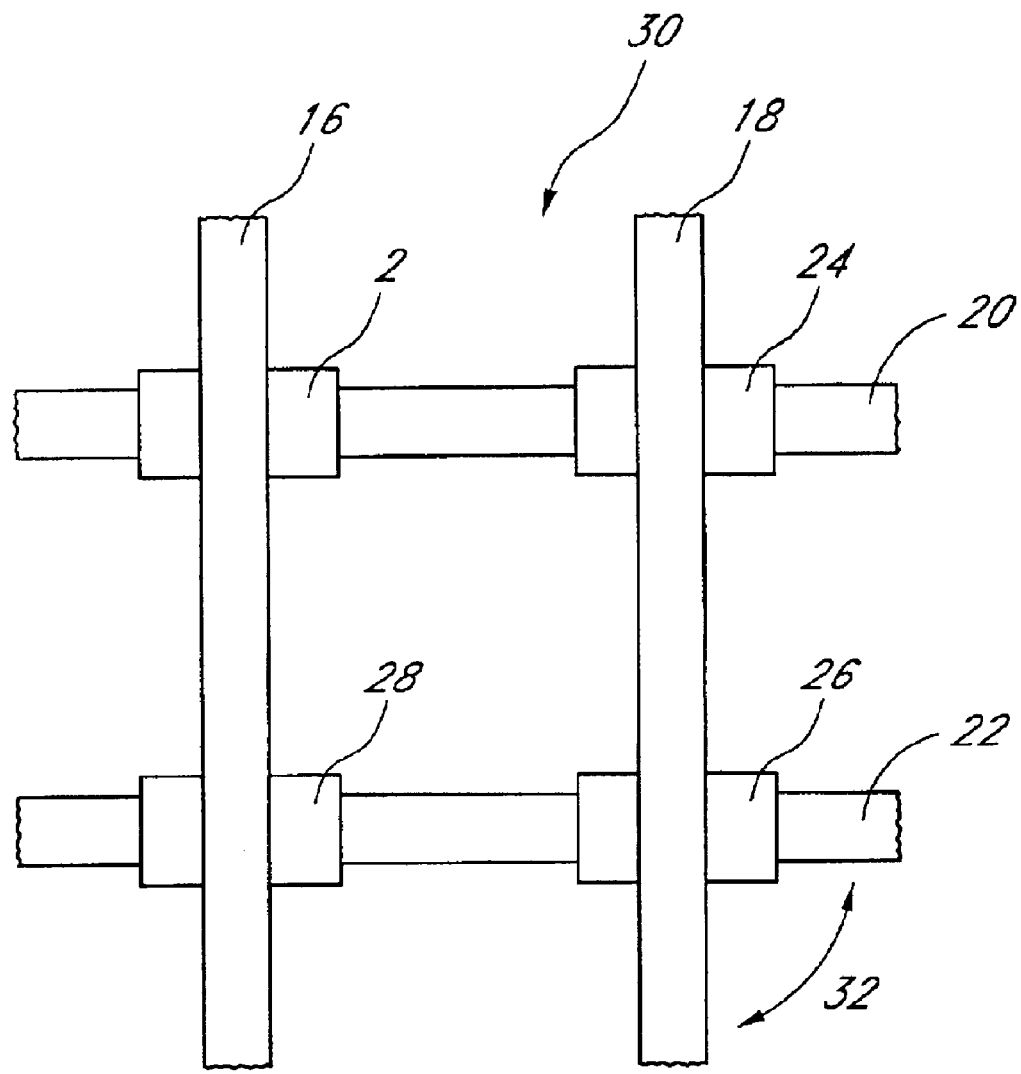
FIG. 6 is a top view of a magneto-resistive memory which incorporates the present teachings.

FIG. 6 is a top view of an illustrative magneto-resistive memory 30 that incorporates the present teachings. The magneto-resistive memory 30 includes an array of magneto-resistive memory cells, including the magneto-resistive memory cell 2 and additional magneto-resistive memory cells 24–28, each similarly made. Each magneto-resistive memory cell is located at the intersection of at least two conductors, one each from the sets of conductors, 16, 18 and 20, 22.

The sets of conductors allow reading from and writing to the magneto-resistive memory cells. In one embodiment, conductors 16 and 18 are perpendicular to conductors 20 and 22. In other embodiments, the angle 32 formed by conductors 16 and 18 with conductors 20 and 22 may vary so long as a magneto-resistive memory cell 2 at the intersection of two conductors may be selected and switched by a current flowing through the conductors.

While shown forming a rectangular shape, the present teachings do not depend on and, so, do not limit the shape of the magneto-resistive memory cells 2 and 24–28. Further, relative sizes of the conductor lines 16–22 and the magneto-resistive memory cells 2 and 24–28 are illustrative only. Here also, the present teachings do not depend on and, so, do not limit the relative sizes of the conductor lines 16–22 and the magneto-resistive memory cells 2 and 24–28. Further, while magneto-resistive memory cells are typically connected to two conductors, and are illustrated as such, it will be appreciated that this figure only illustrates that, at a minimum, two conductors are necessary for writing to the memory cell. Additional conductors, e.g. an additional, separate conductor (sense line) to sense the resistance of the memory cell, are not illustrated but can be added. In addition, while the order of each layer relative to other layers should be maintained, the present teachings do not limit the orientation of the stack of layers as a whole. For example, the stacks illustrated in FIGS. 4 and 5 may be constructed on a substrate such that they appear upside down relative to the figures.

Consequently, although this invention has been described in terms of a certain preferred embodiment and suggested possible modifications thereto, other embodiments and modifications that may suggest themselves and be apparent to those of ordinary skill in the art are also within the spirit and scope of this invention. Accordingly, the scope of this invention is intended to be defined by the claims that follow.

We claim:

1. A magneto-resistive memory cell, comprising:
   a free magnetic layer;
   a non-magnetic interlayer, wherein the non-magnetic interlayer comprises a conductor and is in contact with the free magnetic layer;
   a pinned magnetic layer, wherein the pinned magnetic layer is in contact with the non-magnetic interlayer; and
   an additional pinned magnetic layer, wherein the pinned magnetic layer is between the free magnetic layer and the additional pinned magnetic layer and wherein a magnetization orientation of the pinned magnetic layer is substantially anti-parallel to a magnetization orientation of the additional pinned magnetic layer such that a magnitude of a net magnetic field from the pinned magnetic layer and the additional pinned magnetic layer is too small to substantially affect a magnetization orientation of the free magnetic layer, wherein the pinned magnetic layer and additional pinned magnetic layer have preselected thicknesses such that a magnitude of a magnetic field of the pinned magnetic layer is substantially equal and substantially opposite to a magnitude of an additional magnetic field of the additional pinned magnetic layer, wherein a magneto-resistive material comprising the pinned magnetic layer is different from a magneto-resistive material comprising the additional pinned magnetic layer.

2. The magneto-resistive memory cell of claim 1, wherein a first magnitude of an applied magnetic field for switching the magnetization orientation of the free magnetic layer in a first direction is about 75–125 percent of a second magnitude of an applied magnetic field for switching the magnetization orientation of the free magnetic layer in a direction substantially opposite to the first direction.

3. The magneto-resistive memory cell of claim 1, wherein the additional pinned magnetic layer comprises a ferromagnetic material with magnetization orientation pinned by an adjacent layer.

4. The magneto-resistive memory cell of claim 3, wherein the adjacent layer comprises an antiferromagnetic material.

5. The magneto-resistive memory cell of claim 3, wherein the adjacent layer comprises a permanent magnet material.

6. The magneto-resistive memory cell of claim 1, wherein the pinned magnetic layer comprises a permanent magnet.

7. The magneto-resistive memory cell of claim 1, wherein the additional pinned magnetic layer comprises a ferromagnetic material with coercivity sufficiently high such that its magnetization orientation remains fixed in the presence of an applied magnetic field of a magnitude sufficient to switch the magnetization orientation of the free magnetic layer.

8. The magneto-resistive memory cell of claim 1, wherein the pinned magnetic layer and the additional pinned magnetic layer are separated by a separating layer.

9. The magneto-resistive memory cell of claim 8, wherein the separating layer is ruthenium.

10. The magneto-resistive memory cell of claim 1, wherein the nonmagnetic interlayer comprises copper.

11. The magneto-resistive memory cell of claim 10, formed within a giant magneto-resistive (GMR) memory array.

12. A method of constructing a magneto-resistive memory cell, comprising:
   forming a first magnetic layer;
   forming a non-magnetic interlayer, wherein the non-magnetic interlayer comprises a conductor;
   forming a second magnetic layer without forming another magnetic layer between the first magnetic layer and the second magnetic layer;

forming a first fixed magnetic layer by applying a first magnetic field to fix a magnetization orientation of the first magnetic layer; and forming a second fixed magnetic layer by applying a second magnetic field to fix a magnetization orientation of the second magnetic layer in an opposite direction from the magnetization orientation of the first magnetic layer, wherein a set of ferromagnetic and antiferromagnetic coupling fields of the second fixed magnetic layer balance an additional set of ferromagnetic and antiferromagnetic coupling fields from the first fixed magnetic layer;

wherein a magnetic material used in forming the first fixed magnetic layer is different from a magnetic material used in forming the second fixed magnetic layer.

13. The method of claim 12, wherein the first magnetic layer and the second magnetic layer have substantially the same thickness.

14. The method of claim 12, wherein the first magnetic layer and the second magnetic layer are formed sequentially.

15. The method of claim 14, wherein the conductor comprises copper.

* * * * *